United States Patent [19]

Holz

[11] Patent Number: 4,699,871
[45] Date of Patent: Oct. 13, 1987

[54] METHODS FOR DEVELOPING HIGH SPEED CHIP CARRIERS WITH IMPEDANCE MATCHING PACKAGING

[75] Inventor: Gary L. Holz, San Diego, Calif.
[73] Assignee: General Microelectronics Corp., San Diego, Calif.
[21] Appl. No.: 827,953
[22] Filed: Feb. 10, 1986
[51] Int. Cl.$^4$ .............................................. G03C 5/00
[52] U.S. Cl. .................................... 430/314; 430/316; 430/317; 430/318; 430/330; 204/15
[58] Field of Search ............... 430/313, 314, 315, 318, 430/317, 316, 330, 312, 394; 204/15, 56.1, 58

[56] References Cited

U.S. PATENT DOCUMENTS 3,893,742 7/1975 Blanchard et al. ............. 339/119 R
3,988,648 10/1976 Robinson ............................ 361/403
4,339,305 7/1982 Jones .................................. 156/650

Primary Examiner—John E. Kittle
Assistant Examiner—José G. Dees
Attorney, Agent, or Firm—Charmasson & Holz

[57] ABSTRACT

A process for manufacturing a microcircuit carrier having resistive or capacitive lead terminations which comprises the steps of preparing a plate-up pattern on the substrate, laying out resistive lead terminations, capacitive lead terminations, or a combination of resistive and capacitive lead terminations, and packaging the carrier. The step of laying out resistive lead terminations comprises depositing resistor material along a resistive pattern, and laser trimming the resistor material to value. The step of laying out the capacitive lead terminations comprises depositing lower capacitor pads, hard anodizing said lower capacitor pads, and depositing the upper capacitor pads.

9 Claims, 10 Drawing Figures

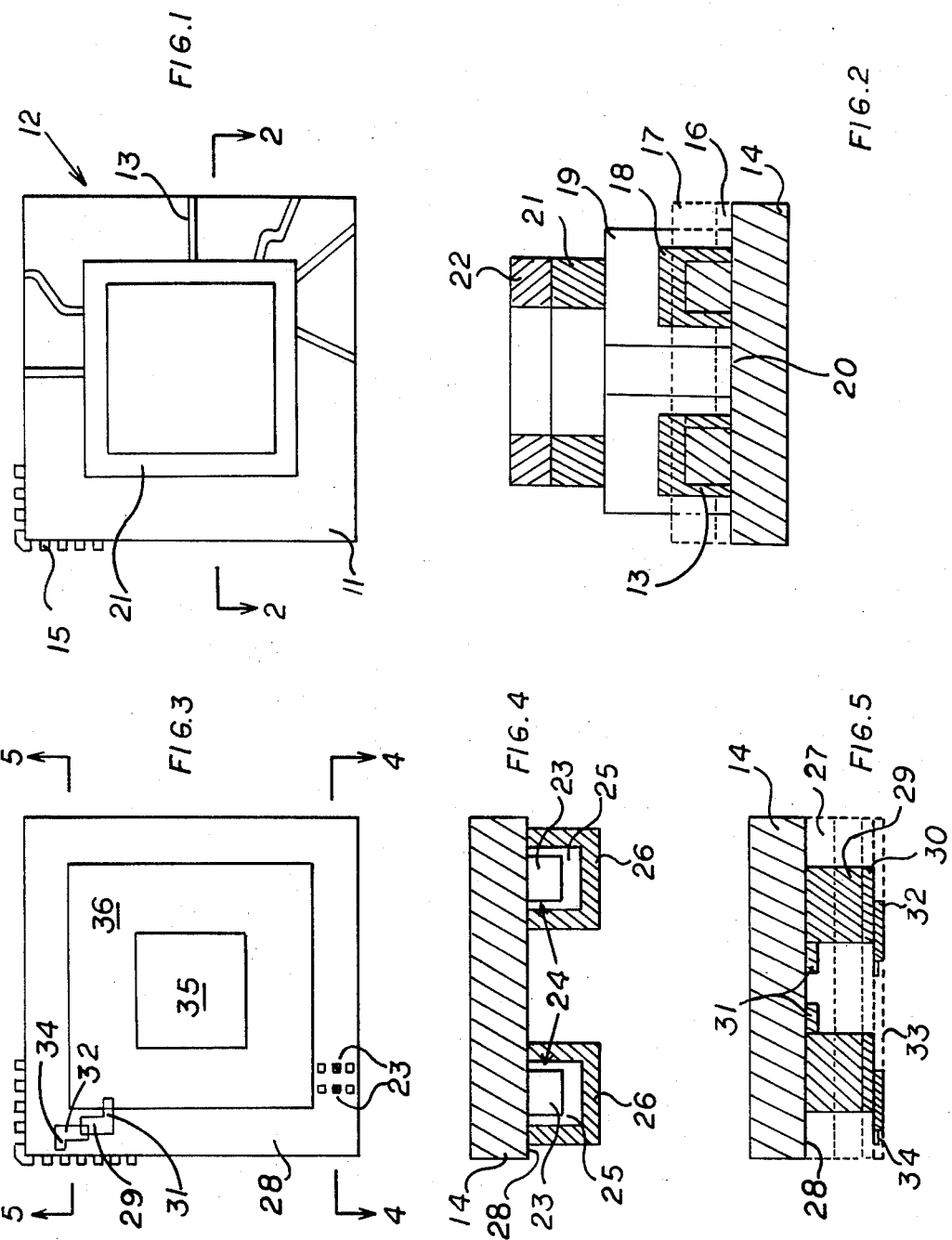

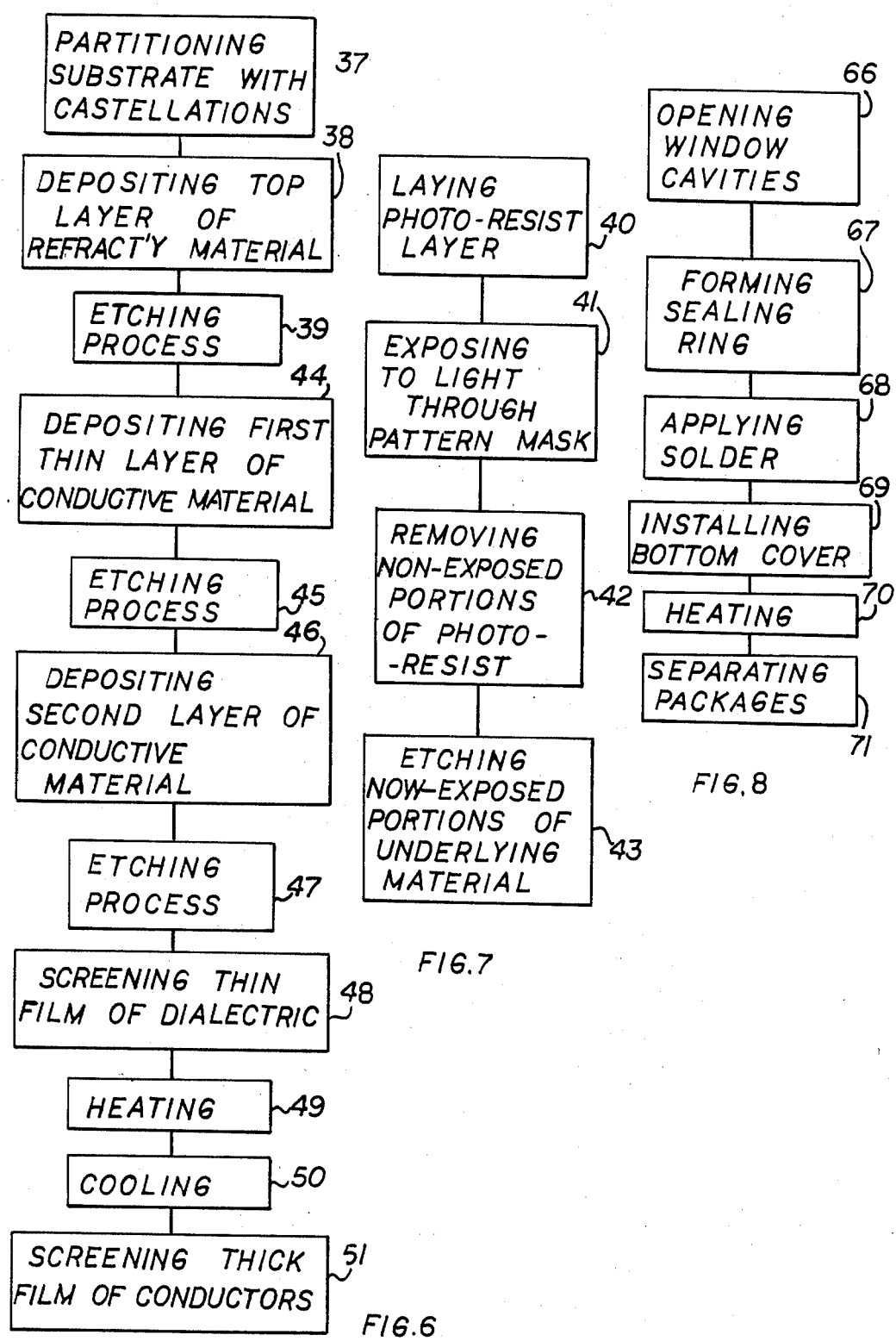

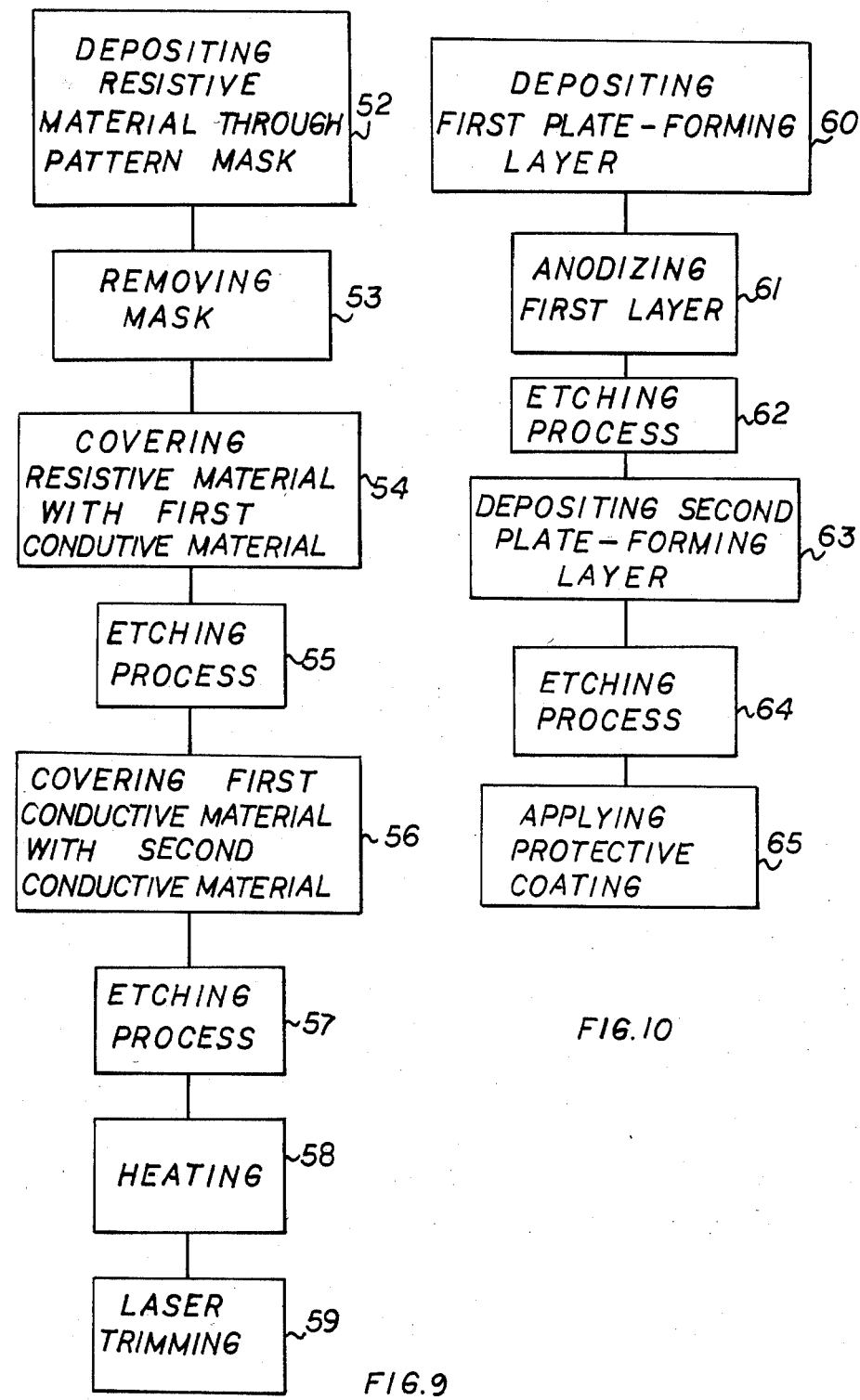

METHODS FOR DEVELOPING HIGH SPEED CHIP CARRIERS WITH IMPEDANCE MATCHING PACKAGING

FIELD OF THE INVENTION

The present invention relates to chip carriers and more specifically to methods for developing high speed chip carriers with impedance matching packaging.

BACKGROUND OF THE INVENTION

Advances in semiconductor technology have produced new high density, high I/O count and superior high technology families of advanced IC's, VHSIC and VLSI circuits, and high frequency microwave devices.

These advances emanating from materials improvement such as Gallium Arsenide (GaAs) and sub-micron processing are of no value unless interconnection and compatible interface between those materials and outside circuitry can be accomplished. The operating speed of those materials is restricted to the present packaging interconnection technique, which utilize external resistors and capacitors to create a terminating resistors, coupling and/or decoupling capacitors. The use of those external components creates serious problems such as noise and standing waves.

Packaging and interconnection of these new materials is the leading concern facing the communication and high tech industries. No comprehensive solution has yet been developed.

SUMMARY OF THE INVENTION

The principal and secondary objects of the invention are:

to provide impedance matching package between the active silicon and/or GaAs device and the external circuitry;

to create terminating resistors for the active silicon and/or GaAs device;

to create coupling capacitors for the silicon and/or the GaAs device;

to create decoupling capacitors for the silicon and/or GaAs device;

to create terminating resistors and coupling capacitors for the active silicon and/or GaAs device; and to create terminating resistors and decoupling capacitors for the silicon and/or GaAs device.

BRIEF DESCRIPTION OF THE DRAWINGS

FIG. 1 is the top plan view of the carrier;

FIG. 2 is the cross-sectional view of the carrier along line 2—2 in FIG. 1;

FIG. 3 is the bottom plan view of the carrier;

FIG. 4 is the cross-sectional view of the carrier along line 4—4 in FIG. 3;

FIG. 5 is the cross-sectional view of the carrier along line 5—5 of FIG. 1.

FIG. 6 is a block diagram of the carrier top forming process;

FIG. 7 is a block diagram of the etching process;

FIG. 8 is a block diagram of the package sealing process;

FIG. 9 is a block diagram of the resistive terminal forming process; and

FIG. 10 is the capacitive terminal forming process.

DESCRIPTION OF THE PREFERRED EMBODIMENT

FIG. 1, 6 and 7 illustrate the process forming the top of the micro-circuit carrier 12. The first step in the manufacturing process of the carrier 10 comprises the step of preparing a plate-up pattern 13 on the top side 11 of the substrate sheet 14.

The substrate 14 is first divided 37 into individual packages or carriers by laser scribing castellations 15 on the substrate sheet 14. The substrate sheet 14 could be made out of Berylium Oxide (BeO), ceramic, co-fire ceramic, Polyimide, or circuit board material.

As indicated in FIG. 2, a layer of refractory metal 16 is then vacuum deposited 38 on said substrate sheet 14. A photo-resist layer 17 (shown in dotted line) is then laid 40 over said layer of refractory metal 16. The plate-up pattern 13 is then defined over the photo-resist layer 17, by exposing 41 it to light.

Thereafter, the non-exposed portion of the photo-resist layer 17 and the portion of the refractor metal 16 thereunder are etched back 42, 43 or removed, by chemical process for example.

A first thin layer of conductive material 18, about 39.37 micro centimeters (100 micro inches) normally of platinum or nickel, is then deposited 44 over the exposed portion of the substrate 20 and the plate-up pattern 13 of refractory metals 16.

The same or similar process as used above and illustrated in FIG. 7, of etching back 45 the metal layer 16 is repeated again, and shall be referred to hereinafter as the "etching back process", for easy reference.

The "etching back process" comprises the steps of laying 40 a photo-resist layer (not shown) over said first conductive layer 18, of exposing 41 the photo-resisting or photo-resist layer to define the same plate-up pattern 13 as before, and lastly to etch back 42 the non-exposed or undesired portion of the first layer 18 and the photo-resisting layer.

A second thin layer of conductive material 19, about 78.74 micro centimeters (200 micro inches) of gold, is then plated over 43 the exposed portion of the substrate 20 and the plate-up pattern 13 of the second layer 19.

The "etching back process" is then used to build or deposit a second layer of conductive material 19 over the plate-up pattern 13.

The result of the above steps would be to molecularly bond the first and second conductive layers 18 and 19; and to bond the first conductive layer 18 to the substrate 14. The layer of refractory metal 16 is basically used to enable such affordable bonding and to interface between the first conductive layer 18 and the substrate 14.

The next step is to screen 48 a thick film of dielectric base 21 to a desired thickness. This dielectric base 21 is usually shaped in a ring, as shown in FIG. 1.

The novel step or process is the bonding of the thick film of dielectric base 21 to the thin film of conductive metal 19. Such process is accomplished during the drying process of the thick film dielectric base 21. The substrate 14 and all the layers 16, 18, 19 and 21 are placed 49 in a furnace at a temperature in excess of 625° C., for about twenty (20) minutes, thereby allowing the substrate 14 and the layers thereupon to warm up and cool off 50 for about another twenty (20) minutes.

The gold layer 19 would normally evaporate and/or degrade from the substrate sheet 14 at the temperature of 625° C. However, because of the previous processes of bonding the three layers 16, 18 and 19, the gold layer 19 will be stablilized and will not be substantially affected by the high temperature exposure.

Once the thick dielectric base 21 has dried, a thick film of conductive material 22, normally gold, is screened 51 on top of the thick film of dielectric base 21. The thick film 22 is then dried.

At this stage of the manufacturing process, a plate-up pattern 13 has been prepared on the front side of the substrate 14. It therefore remains to lay out the resistive and/or the capacitive components on the backside of the substrate 14, and to package the carrier 12.

The present novel process enables the formation of resistive lead terminations, capacitive lead terminations, and/or of a combination of resistive and capacitive lead terminations.

We start with the process of forming the resistive lead terminations, as illustrated in FIGS. 3, 4 and 9. A mask (not shown) is used to cover the backside of the substrate 14 and to provide the resistive pattern 24. Resistor materials 23, normally Nichrome or Cermet (Chromium Silicon Monoxide), is then deposited along the resistive pattern 24.

The mask is then removed 53, and a first layer of conductive material 25, normally of platinum or nickel, about 39.37 centimeters (100 micro inches), is deposited 54 on the backside of substrate 14, and over the resistive pattern 24. The "etching back process", as described above is then used 55 to build or deposit a first layer of conductive material 25 over the resistive pattern 24.

The same or similar process is also used to build or deposit 56, 57 a second layer of conductive material 26 above the first layer 25 and along resistive pattern 24. The second layer is normally made out of gold, and is about 78.74 micro centimeters (200 micro inches) thick.

The resistor material 23 is then stabilized by placing 58 the carrier 12 on a hot plate at a temperature of about 300° C., for approximately fifteen (15) minutes. Once the stabilization process is complete, the resistor material 23 is laser trimmed 59 to value.

The process of forming capacitive lead terminations is illustrated in FIGS. 3, 5 and 10. As discussed above, the plate-up pattern 13 is first prepared on the front side 11 of the substrate 14.

The first conductive layer 27, normally aluminum, Hafnium or Zirconium, is then deposited 60 on the backside 28 of the substrate 14. Lower capacitor pads 29 and their interconnections 31 are then defined.

The lower capacitor pads 29 are hard anodized 61 by placing a pre-determined voltage across said lower pads 29 in order to create a dielectric oxide layer 30. Such dielectric oxide will serve as the capacitor dielectric layer, once the upper capacitor pads 32 are deposited thereon.

The "etching back process" 62, as discussed above, is then used to remove the photo-resist layer and the undesired portion of the first conductive layer 27.

A second conductive layer 33, usually Aluminum Hafnium or Zirconium, is deposited 63 over the backside 28 of the carrier 12. Upper capacitor pads 32 and their interconnections 34 are then defined.

The "etching back process" 64, is then used to remove the photo-resist layer and the undesired portion of the second conductive layer 33.

A protective coating (not shown) is then applied 65 to the upper and lower capacitor pads 32 and 29.

The formation of a combination of resistive and capacitive lead terminations is accomplished by combining the above two processes.

The last stage in the present manufacturing process is the packaging of the carrier 12, as illustrated in FIGS. 3 and 8. A window cavity 35 is opened 66 in said substrate 14. A sealing ring 36 is then formed 67 over the window cavity 35. A gold-tin evtectic solder paste (not shown) is then applied 68 to the sealing ring 36.

A package bottom (not shown) is then placed 69 on said solder paste. The package is then heated 70 in dry nitrogen until the solder flows. The package substrate 14 is then cleaned completely to remove the solder flux. Finally, the substrate 14 is broken 71 along described lines to obtain individual packages or carriers 12.

While the preferred embodiment of the invention has been described and modifications thereto have been suggested, other applications could be devised and other changes could be made without departing form the spirit of the invention and the scope of the appended claims.

What is claimed is:

1. A photolitographic process for forming resistive lead terminations on the substrate of a microcircuit carrier which comprises the steps of:
   a. depositing a resistor material on the backside of the substrate through a pattern mask defining resistive lead terminations;
   b. depositing a first layer of conductive metal over the backside of the substrate to cover the resistor;
   c. laying a photo-resist layer over said layer of conductive material;
   d. exposing to light the photo-resist layer to define an etch-resistive mask over the resistor material.
   e. removing the non-exposed portions of the photo-resist layer and etching back the portions of the first layer of conductive metal exposed by said removing;
   f. depositing a second layer of conductive metal over the backside of the substrate to cover the first layer of conductive metal;
   g. repeating steps c through e;
   h. stabilizing the resistor material; and
   i. trimming the resistor material to value.

2. The process of claim 1, wherein the steps of depositing the first layer and depositing the second layer of conductive metal comprise the steps of:
   plating-up a thin layer of platinum as the first layer; and
   plating-up a thin layer of gold as the second layer.

3. The process of claim 1, wherein the step of stabilizing the resistor material comprises bringing the carrier to a temperature of about 300° C.

4. The process of claim 1, wherein the step of depositing a resistor material includes depositing Nicrome.

5. The process of claim 1, wherein the step of depositing a resistor material includes depositing Chromium Silicon Monoxide.

6. The process of claim 1 which further comprises the preliminary steps of:
   vacuum depositing a layer of refractory metal on the front side of the substrate;
   laying one photo-resist layer over said layer of refractory metal;
   exposing to light the photo-resist layer to define an etch-resistive plate-up pattern;
   removing the non-exposed portions of the photo-resist layer; and
   etching back the portions of said layer of refractive metal exposed by said removing;
   plating-up a first layer of conductive metal;

laying a first photo-resist layer over said first layer of conductive metal;

exposing to light the first photo-resist layer to define a second etch-resistive plate-up pattern;

removing the non-exposed portions of the first photo-resist layer, and etching back the portions of the first layer of conductive metal exposed by said removing;

plating-up a second layer of conductive metal;

laying a second photo-resist layer over said second layer of conductive metal;

exposing to light the second photo-resist layer to define a third etch-resistive plate-up pattern;

removing the non-exposed portions of the second photo-resist layer, and etching back the portions of the second layer of conductive metal exposed by said removing;

screening a thick film of dielectric base to the desired thickness, covering said second layer of conductive metal;

heat-bonding the thick film of dielectric base to the second layer of conductive metal;

screening a thick film of conductive metal over the film of dielectric base; and drying the film of conductive metal.

7. The process of claim 6, wherein the steps of plating-up said layers of conductive metal comprise the steps of:

plating-up a thin layer of platinum as the first layer; and plating-up a thin layer of gold as the second layer.

8. The process of claim 6, wherein the step of heat-bonding the thick film of dielectric base to the second layer of conductive metal comprises heating the carrier to a temperature in excess of 625° C.

9. The process of claim 8, wherein the step of heating comprises maintaining said heat for a period of about twenty minutes.

* * * * *